United States Patent
Wang et al.

(10) Patent No.: US 6,465,160 B1
(45) Date of Patent: Oct. 15, 2002

(54) METHOD FOR PREVENTING SIDE-LOBES IN PHOTOLITHOGRAPHY

(75) Inventors: Li-Ming Wang, Taoyuan (TW); Kao-Tsair Tsai, Kaohsiung (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/513,269

(22) Filed: Feb. 24, 2000

(30) Foreign Application Priority Data

Dec. 31, 1999 (TW) ...................... 088123393 A

(51) Int. Cl.⁷ .......................... G03C 1/725; G03C 1/73; G03C 1/735; G03C 5/00
(52) U.S. Cl. ........................... 430/322; 430/325; 430/5
(58) Field of Search .............................. 430/5, 322, 325

(56) References Cited

U.S. PATENT DOCUMENTS 6,214,497 B1 * 4/2001 Stanton ........................ 430/5
6,218,082 B1 * 4/2001 Yang .......................... 430/325
6,255,024 B1 * 7/2001 Pierrat .......................... 430/5

* cited by examiner

*Primary Examiner*—Geraldine Letscher
(74) *Attorney, Agent, or Firm*—J.C. Patents

(57) ABSTRACT

A method for the mitigation of the generation of side-lobes in a photolithography process is described. The method includes the steps of forming a photoresist layer on a semiconductor substrate. An exposure process is conducted on the photoresist layer with a phase-shifting mask, transferring the pattern of the mask on the photoresist layer. After this, a post-exposure baking process is conducted on the photoresist layer after it has been exposed, followed by performing a development process to complete the patterning of the photoresist layer.

5 Claims, 5 Drawing Sheets

(a)

(b)

METHOD FOR PREVENTING SIDE-LOBES IN PHOTOLITHOGRAPHY

CROSS-REFERENCE TO RELATED APPLICATION

This application claims the priority benefit of Taiwan application Ser. No. 88123393, filed Dec. 31, 1999.

BACKGROUND OF THE INVENTION

1. Field of the Invention

The present invention relates to a photolithography process. More particularly, the present invention relates to a method for preventing the generation of side-lobes in a photolithography process.

2. Description of the Related Art

Photolithography plays an essential role during the manufacturing of a semiconductor device. Processes like etching and doping are all accomplished through a photolithography process. In a photolithography process, exposure resolution is an important determining factor for the quality of photolithography. The phase-shifting mask (PSM) technique is employed to provide better resolution, wherein the attenuated PSM is especially effective to project isolated or sparse patterns without adding complexity to the mask making process. Using the PSM, on the other hand, would generate unexpected side-lobes around the main pattern due to the intersection of light diffraction.

FIG. 1 is a schematic, cross-section of a photoresist after the exposure and development processes using the conventional attenuated PSM. As shown in FIG. 1, an opening 106 pattern is formed after exposing and developing the photoresist layer 104 with a mask 100. The region that is not expected to be patterned, however, is also partially exposed due to the summary of light diffraction, forming a side-lobe 108 after development.

The conventional approaches in preventing the generation of side-lobes include increasing the pattern void size and therefore reducing the exposure energy, using mask with a low transmittance rate, or adding auxiliary patterns on the corresponding side-lobe region of the mask. These methods, however, are not very convenient and the processes are complicated.

SUMMARY OF THE INVENTION

Based on the foregoing, the present invention provides a simple and effective method to suppress the generation of side-lobes in a photolithography process.

The present invention provides a method to mitigate the generation of side-lobes in a photolithography process, wherein the parameters of the photolithography process, such as the post-exposure baking time and temperature and the soft-baking time and temperature, are adjusted in order to increase the contrast of the photoresist pattern and to suppress the generation of side-lobes.

Accordingly, the present invention provides an increased of the photoresist contrast by adjusting some process parameters to suppress the side-lobe phenomenon. According to a preferred embodiment of the present invention, wherein the method provides a mitigation of the side-lobes generation in a photolithography process. The method includes the steps of forming a photoresist layer on a semiconductor substrate. An exposure is performed on the photoresist layer using an attenuated phase-shifting mask, transferring the pattern on the mask to the photoresist layer. Thereafter, a post-exposure baking process is conducted on the photoresist layer after it has been exposed. A development process is subsequently conducted to complete the patterning of the photoresist layer.

According to a preferred embodiment of the present invention, the post-exposure baking process, performed on the photoresist layer after it has been exposed, is at about 130 degrees Celsius.

According to a preferred embodiment of the present invention, the post-exposure baking process, performed on the photoresist layer after it has been exposed, is for about 90 seconds.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

The present invention increases the contrast in a photolithography process by varying the parameters in the photolithography process. The generation of side-lobes is thereby reduced. The meaning of contrast is explained by FIG. 2 in the following.

Figure 1:
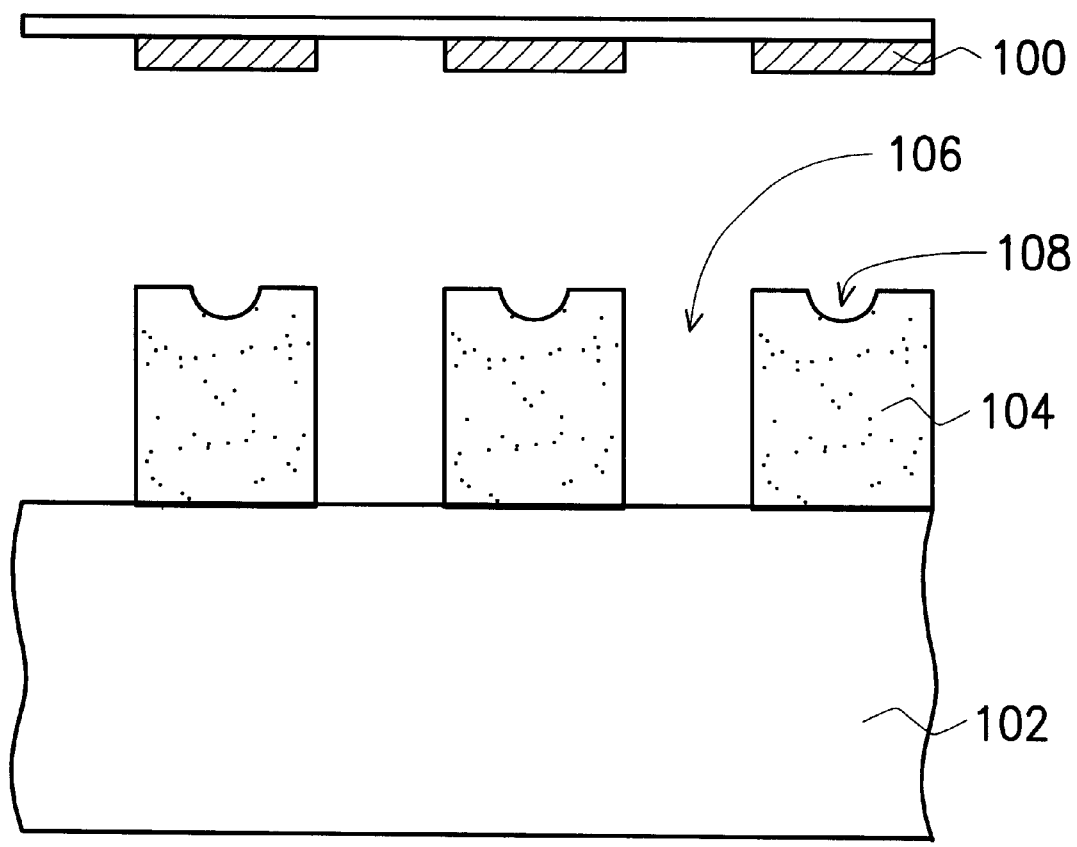
FIG. 1 is a schematic, cross-sectional view of a photoresist after the exposure and development processes using the conventional attenuated PSM.
Figure 2:
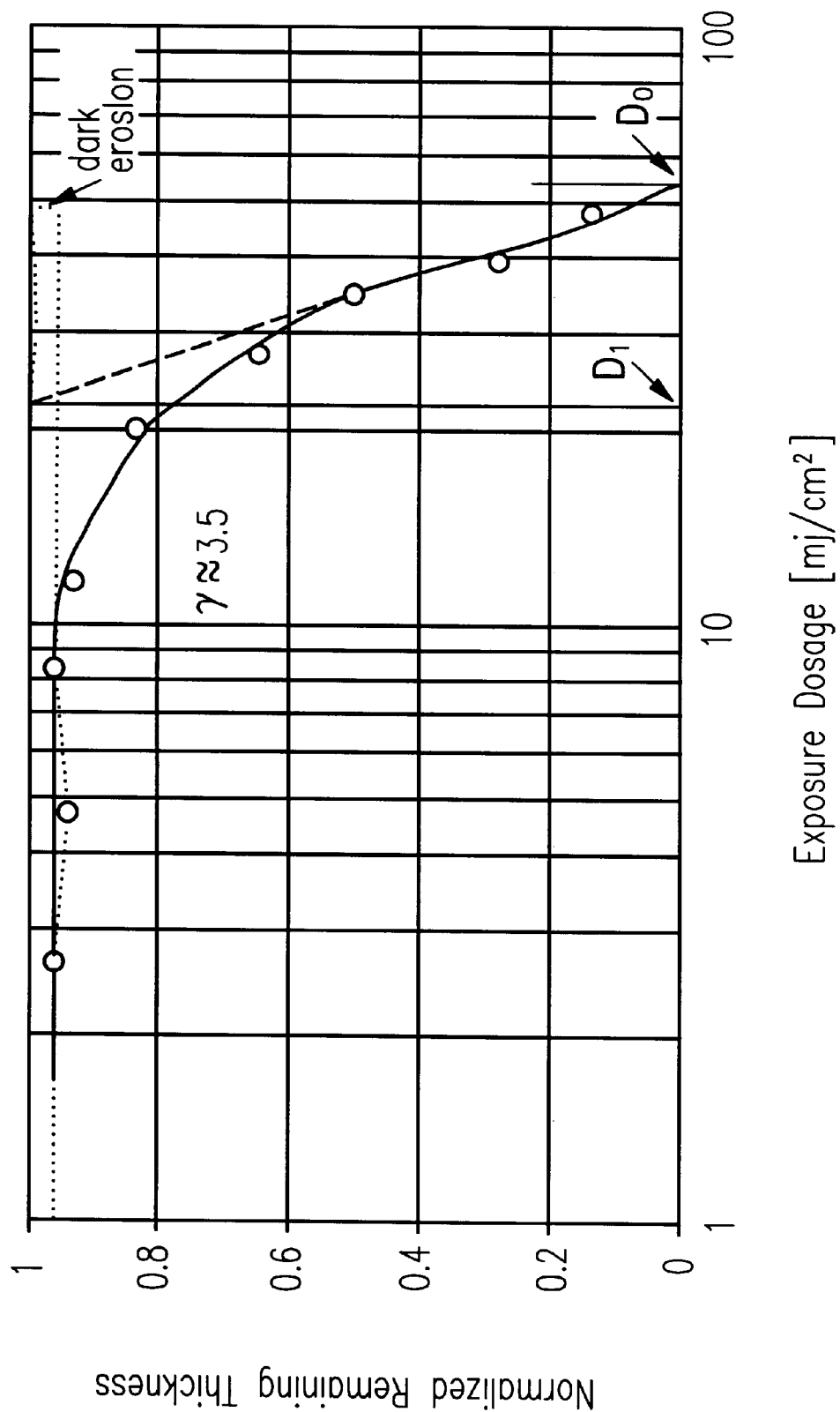
FIG. 2 is a graph illustrating the function of the remaining thickness of the photoresist to the exposure dosage.

FIG. 2 is a graph illustrating the function of the remaining thickness of the photoresist to the exposure dosage. As shown in FIG. 2, the exposure dosage must surpass a certain amount to induce the photoresist development. In other words, when the exposure dosage is less than a certain amount the remaining thickness of the photoresist layer remains unchanged after the exposure. When the exposure dosage surpasses a certain amount, the remaining thickness of the photoresist decreases as the exposure dosage increases. The resist contrast ($\gamma$) is defined as the slope of the slanted portion of the graph in FIG. 2 and is represented by Equation (1):

$$\gamma = \frac{1}{\log\left(\frac{D_0}{D1}\right)} = \frac{1}{\log D_0 - \log D_1} \quad (1)$$

Many factors affect the resist contrast (γ). Examples of such factors include the temperature and the time of post-exposure baking, the time and temperature of the development process, the time and temperature of the photoresist soft-baking process. The effects of the post-exposure baking temperature and the photoresist soft-baking temperature are more prominent, wherein the effect of the post-exposure baking temperature is the most significant.

Figure 3:
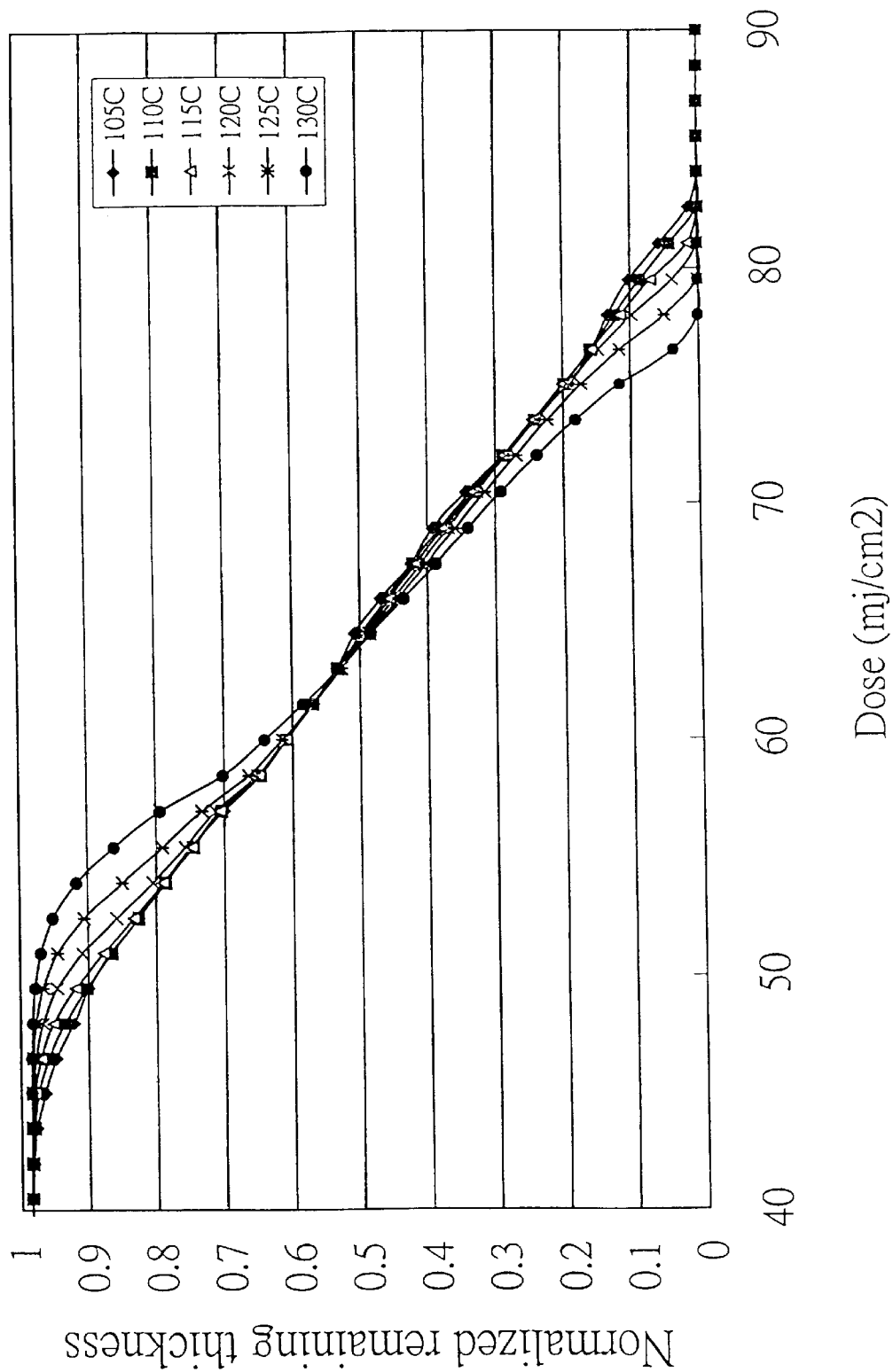
FIG. 3 is a graph illustrating the function of the remaining thickness of the photoresist to the exposure dosage at different post-exposure baking temperatures.

FIG. 3 is a graph illustrating the function of the remaining thickness of the photoresist to the exposure dosage at different post-exposure baking temperatures. As shown in FIG. 3, the slope of the slanted line increases as the post-exposure baking temperature increases. In other words, the contrast of the photoresist increases as the post-exposure baking temperature increases, and the side-lobe phenomenon is suppressed.

The manufacturing conditions of FIG. 3 are summarized as following:

Photoresist layer deposition thickness: 0.91 micron of PFI-58 (Sumitomo, I-line photoresist)

Soft-baking: 90 degrees Celsius for 60 seconds

Development: 2.38 wt % TMAH (puddle 60 seconds)

Exposure energy: 40–90 mj/cm$^2$

Resist Contrast versus PEB Temperature:

| PEB Temperature (Celsius) (90 sec.) | Resist Contrast (γ) |
| --- | --- |
| 105 | 1.75 |
| 110 | 1.76 |
| 115 | 1.79 |
| 120 | 1.80 |
| 125 | 1.91 |
| 130 | 2.17 |

The result shows that the resist contrast value depend on the PEB temperature. The higher the PEB temperature, the higher the resist contrast value; therefore, the side-lobes printing is eliminated.

One important point to note is that the above embodiment of the present invention has been described with respect to the above processing conditions, the invention however is applicable also to other processing conditions.

As shown in FIG. 3, the post-exposure baking temperature performed on the photoresist layer after exposure definitely alters the resist contrast of the photoresist layer. Using the concept from FIG. 3 on a semiconductor photolithography process can reduce the generation of side-lobes.

Figure 4:
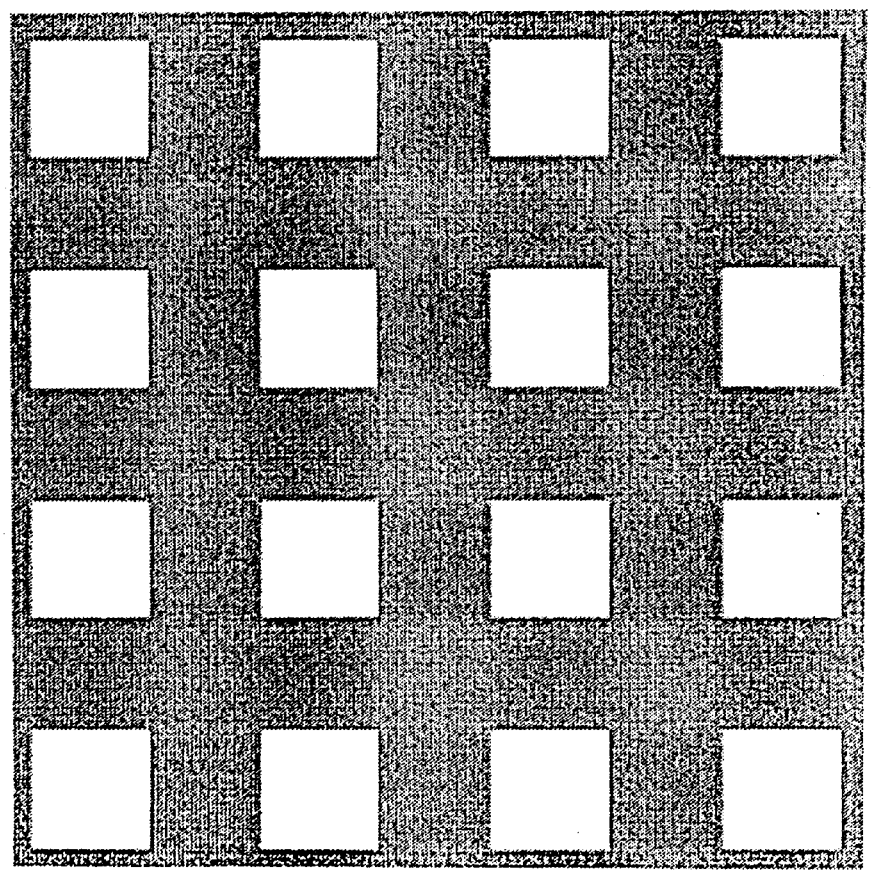
FIG. 4 is a schematic diagram illustrating a contact layout pattern on an attenuated phase-shift mask.
Figure 5:
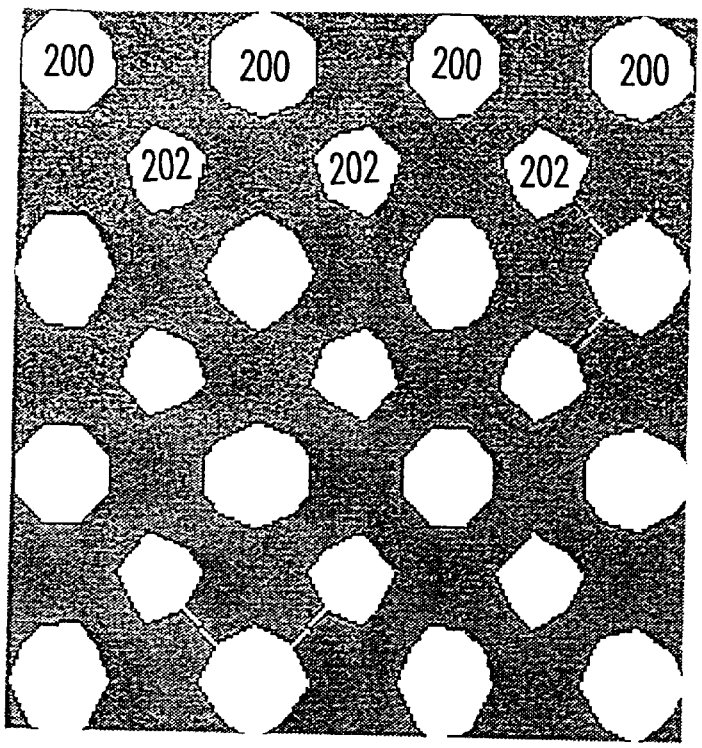
FIG. 5a is diagram illustrating the exposure result using the conventional photolithography process using the mask in FIG. 4.
FIG. 5b is a diagram illustrating the exposure result using the method according to the preferred embodiment of the present invention using the mask in FIG. 4.
Figure 5:
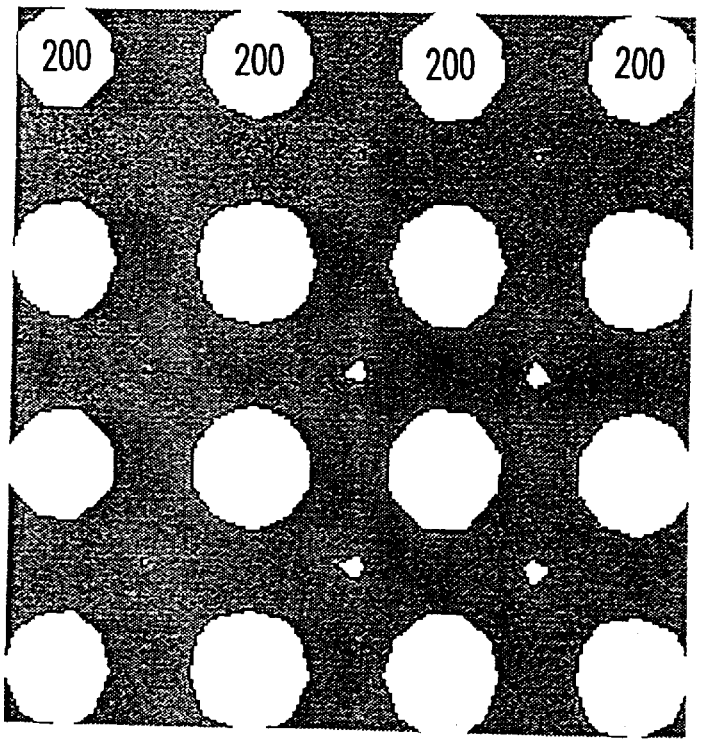

FIGS. 4 & 5 are diagrams illustrating the results according to the processing conditions of the preferred embodiment of the present invention.

FIG. 4 is a schematic diagram illustrating a contact layout pattern on an attenuated phase-shift mask.

FIGS. 5a and 5b are diagrams illustrating the patterns on the photoresist layer after the exposure and development processes. The printed pattern obtained in FIG. 5a is based on a PEB temperature of about 110 degrees Celsius. The printed pattern in FIG. 5b is obtained at a PEB temperature of about 130 degrees Celsius. As shown in FIG. 5a, besides the main pattern 200, side-lobes 202 are generated in the non-exposed region. On the other hand, as shown in FIG. 5b, only the main pattern 200 is shown. Accordingly, the generation of side-lobes is completely eliminated by increasing the post-exposure baking temperature or, on the other hand, by increasing the photoresist contrast.

Based on the preferred embodiment of the present invention, the present invention comprises at least the following characteristics.

By increasing the photoresist contrast during photolithography, the generation of side-lobes is reduced. Simply adjusting the process parameters can increase the photoresist contrast. Since no additional photomask and no extra processing steps are required according to the preferred embodiment of the present invention, it is thus compatible for the existing manufacturing process. Furthermore, the present invention is not limited to the types of the photoresist and is applicable to an ArF1, KrF1, I-lineor a G-line type of photoresist. The applicability of the present invention is thus very broad.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method to reduce side-lobes in a photolithography process, the method comprising the steps of:

providing a substrate;

forming a photoresist layer on the substrate;

performing an exposure process on the photoresist layer with a mask;

performing a post-exposure baking process on the photoresist layer after the photoresist layer has been exposed, wherein the post-exposure baking process is conducted at a high temperature sufficient to increase the resist contrast value of the photoresist pattern and thereby suppress the generation of side-lobes; and performing a development process on the photoresist layer.

2. The method to reduce side-lobes in a photolithography process according to claim 1, wherein the post-exposure baking process is conducted for about 90 seconds.

3. The method to reduce side-lobes in a photolithography process according to claim 1, wherein after the formation of the photoresist layer and before the exposure process, the method further includes performing a soft-baking process and the soft-baking process is performed at about 90 degrees Celsius for about 60 seconds.

4. A photolithography process comprising:

providing a substrate;

forming a photoresist layer on the substrate;

performing a soft-baking process;

performing an exposure process on the photoresist layer with a mask;

performing a post-exposure baking process on the photoresist layer after the photoresist layer has been exposed, wherein the post-exposure baking process is conducted at a temperature of about 130 degree Celsius for a period of time sufficient to increase the resist contrast value of the photoresist pattern; and performing a development process on the photoresist layer.

5. The photolithography process according to claim 4, wherein the soft-baking process is conducted at about 90 degrees Celsius for about 60 seconds.

* * * * *